United States Patent
Ling et al.

(10) Patent No.: US 8,980,758 B1
(45) Date of Patent: Mar. 17, 2015

(54) METHODS FOR ETCHING AN ETCHING STOP LAYER UTILIZING A CYCLICAL ETCHING PROCESS

(71) Applicant: Applied Materials, Inc., Santa Clara, CA (US)

(72) Inventors: Mang-Mang Ling, San Jose, CA (US); Sean S. Kang, San Ramon, CA (US); Jeremiah T. P. Pender, San Jose, CA (US); Srinivas D. Nemani, Sunnyvale, CA (US); Bradley Howard, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/029,769

(22) Filed: Sep. 17, 2013

(51) Int. Cl.
*H01L 21/302* (2006.01)
*H01L 21/461* (2006.01)
*H01L 21/306* (2006.01)

(52) U.S. Cl.
CPC ............................ *H01L 21/30604* (2013.01)
USPC ............ 438/706; 438/707; 438/714; 438/724

(58) Field of Classification Search
CPC ................. H01L 21/3065; H01L 21/32137; H01L 21/0217; H01L 21/02458; H01L 21/02488
See application file for complete search history.

(56) References Cited

U.S. PATENT DOCUMENTS

| | | | |
|---|---|---|---|
| 5,990,015 A * | 11/1999 | Lin et al. ...................... | 438/706 |
| 2003/0124818 A1 * | 7/2003 | Luo et al. ...................... | 438/482 |
| 2003/0192569 A1 * | 10/2003 | Goto et al. ..................... | 134/1.1 |
| 2007/0165355 A1 | 7/2007 | Sato et al. | |
| 2009/0104782 A1 | 4/2009 | Lu et al. | |
| 2010/0029094 A1 * | 2/2010 | Wang et al. .................... | 438/792 |
| 2011/0275225 A1 * | 11/2011 | Kurita ............................ | 438/761 |
| 2012/0211462 A1 | 8/2012 | Zhang et al. | |
| 2013/0089988 A1 | 4/2013 | Wang et al. | |

FOREIGN PATENT DOCUMENTS

| | | |
|---|---|---|
| KR | 10-442167 B1 | 7/2004 |
| KR | 10-2011-0086540 A | 7/2011 |

OTHER PUBLICATIONS

J. Wang, et al., "High Rate Etching of SIC and Sign in NF3 Inductively Coupled Plasmas", 1998.
C. Reyes-Betanzo, et al., "Silicon Nitride Etching in high and low-density plasmas using SF6/O2/N2 mixtures", Mar./Apr. 2003.
Hee Kwan Lee, et al., "Selective etching of Thick Si3N4, SiO2 and Si by using CF4/O2 and C2F6 gases with or without O2 or Ar addition," May 2009.
B.E.E.Kastenmeier, et al., "Remote Plasma Etching of Silicon Nitride and Silicon Dioxide using NF3/O2 gas mixtures", Jul./Aug. 1998.
PCT international search report and written opinion of PCT/US2014/048550 dated Nov. 21, 2014. The PCT search report is being used as the English translation for the Korean foreign references.

* cited by examiner

*Primary Examiner* — Duy Deo
(74) *Attorney, Agent, or Firm* — Patterson & Sheridan, LLP

(57) ABSTRACT

Methods for etching an etching stop layer disposed on the substrate using a cyclical etching process are provided. In one embodiment, a method for etching an etching stop layer includes performing a treatment process on the substrate having a silicon nitride layer disposed thereon by supplying a treatment gas mixture into the processing chamber to treat the silicon nitride layer, and performing a chemical etching process on the substrate by supplying a chemical etching gas mixture into the processing chamber, wherein the chemical etching gas mixture includes at least an ammonium gas and a nitrogen trifluoride, wherein the chemical etching process etches the treated silicon nitride layer.

18 Claims, 4 Drawing Sheets

METHODS FOR ETCHING AN ETCHING STOP LAYER UTILIZING A CYCLICAL ETCHING PROCESS

BACKGROUND OF THE INVENTION

1. Field of the Invention

Embodiments of the present invention generally relate to methods for forming semiconductor devices. More particularly, embodiments of the present invention generally relate to methods for etching an etching stop layer disposed on a substrate using a cyclically etching process for manufacturing semiconductor devices.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bit lines and the like, on a substrate by an etching process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, the geometry limits of the structures designed to be formed for the semiconductor devices has been pushed against technology limits, the need for accurate process control for the manufacture of small critical dimensional structures with high aspect ratio has become increasingly important. Poor process control during etching process will result in irregular structure profiles and line edge roughness, thereby resulting in poor line integrity of the formed structures. Additionally, irregular profiles and growth of the etching by-products formed during etching may gradually block the small openings used to fabricate the small critical dimension structures, thereby resulting in bowed, distorted, toppled, or twisted profiles of the etched structures.

Furthermore, the similarity between the materials selected for the hardmask layer, the adjacent layers and the underlying etching stop layer disposed in the film stack, and even the underlying material on the substrate, may also result in similar etch properties therebetween, thereby resulting in poor selectivity during etching. Poor selectivity between the hardmask layer, adjacent layers and the materials on the substrate may result in non-uniform, tapered and deformed profile of the hardmask layer, thereby leading to poor pattern transfer and failure of accurate structure dimension control. Accordingly, the etching stop layer is often utilized to provide an etching stop interface that may provide a high etching selectivity to assist protecting the underlying materials from damage and reduce likelihood of over-etching.

Thus, the chemical etchant used in the etch process is required to have a greater etch selectivity for the adjacent material layers, the etching stop layer and the underlying upper surface of the material layer, either a conductive layer or a dielectric layer, so as to provide a good interface control. When the etching stop layer is etched, the adjacent material layers may be attacked by the reactive etchant species, resulting in non-uniformity or tapered profile on the top and/or sidewall of the adjacent material layers, resulting in undesired profile deformation. Thus, a highly selective etchant enhances for accurate pattern transfer is desired. However, conventional etchants are not selective enough to enable robust manufacturing of next generation devices.

Thus, there is a need for improved methods for etching an etching stop layer for manufacturing semiconductor devices with high selectivity and accurate process and profile control.

SUMMARY

Methods for etching an etching stop layer disposed on the substrate using a cyclical etching process are provided. In one embodiment, a method for etching an etching stop layer includes performing a treatment process on the substrate having a silicon nitride layer disposed thereon by supplying a treatment gas mixture into the processing chamber to treat the silicon nitride layer, and performing a chemical etching process on the substrate by supplying a chemical etching gas mixture into the processing chamber, wherein the chemical etching gas mixture includes at least an ammonium gas and a nitrogen trifluoride, wherein the chemical etching process etches the treated silicon nitride layer.

In another embodiment, a method for etching an etching stop layer includes transferring a substrate having a silicon nitride layer disposed thereon in a processing chamber, wherein a patterned silicon oxide layer along with a pattered mask layer disposed on the silicon nitride layer exposing a portion of the silicon nitride layer, supplying a treatment gas mixture to treat the exposed portion of the silicon nitride layer, wherein the treatment gas mixture includes an inert gas, and supplying a chemical etching gas mixture into the processing chamber, wherein the chemical etching gas mixture includes at least an ammonium gas and a nitrogen trifluoride to etch the treated silicon nitride layer.

In yet another embodiment, a method for etching a silicon nitride layer includes transferring a substrate having a silicon nitride layer disposed on a metal silicide structure into a processing chamber, wherein the silicon nitride layer has a patterned silicon oxide layer along with a pattered mask layer disposed thereon exposing a portion of the silicon nitride layer, supplying a Ar or He gas while applying a RF bias power to treat the exposed silicon nitride layer, supplying a chemical etching gas mixture including at least an ammonium gas and a nitrogen trifluoride while applying a RF source power remotely from the processing chamber to etch the treated silicon nitride layer, and supplying a Ar or He gas to the processing chamber without applying a RF power.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods for etching an etching stop layer formed on a substrate for semiconductor devices with high selectivity and accurate profile control. In one embodiment, the etching process includes using a slow cyclical etching process to gradually etch the etching stop layer until the underling substrate is exposed. The slow cyclical etching process may assist controlling the etching selectivity and providing a relatively accurate etch stop endpoint at the interface so as to provide a good profile control for etching through the etching stop layer to expose the underlying substrate. In one embodiment, the etching process may be utilized to etch an etching stop layer utilized in a contact structure for semiconductor devices.

The term "contact structure" as used herein refers to a layer of material that includes a metal silicide that can form part of a gate electrode. In one or more embodiments, the metal silicide can be nickel silicide, cobalt silicide, titanium silicide or any combination thereof. The metal silicide can also include tungsten, tungsten silicide, Ti/Co alloy silicide, Ti/Ni alloy silicide, Co/Ni alloy silicide and Ni/Pt silicide. The contact structure may alternatively be silicon based, germanium based or silicon based with germanium dopant and/or other dopant.

Figure 1:
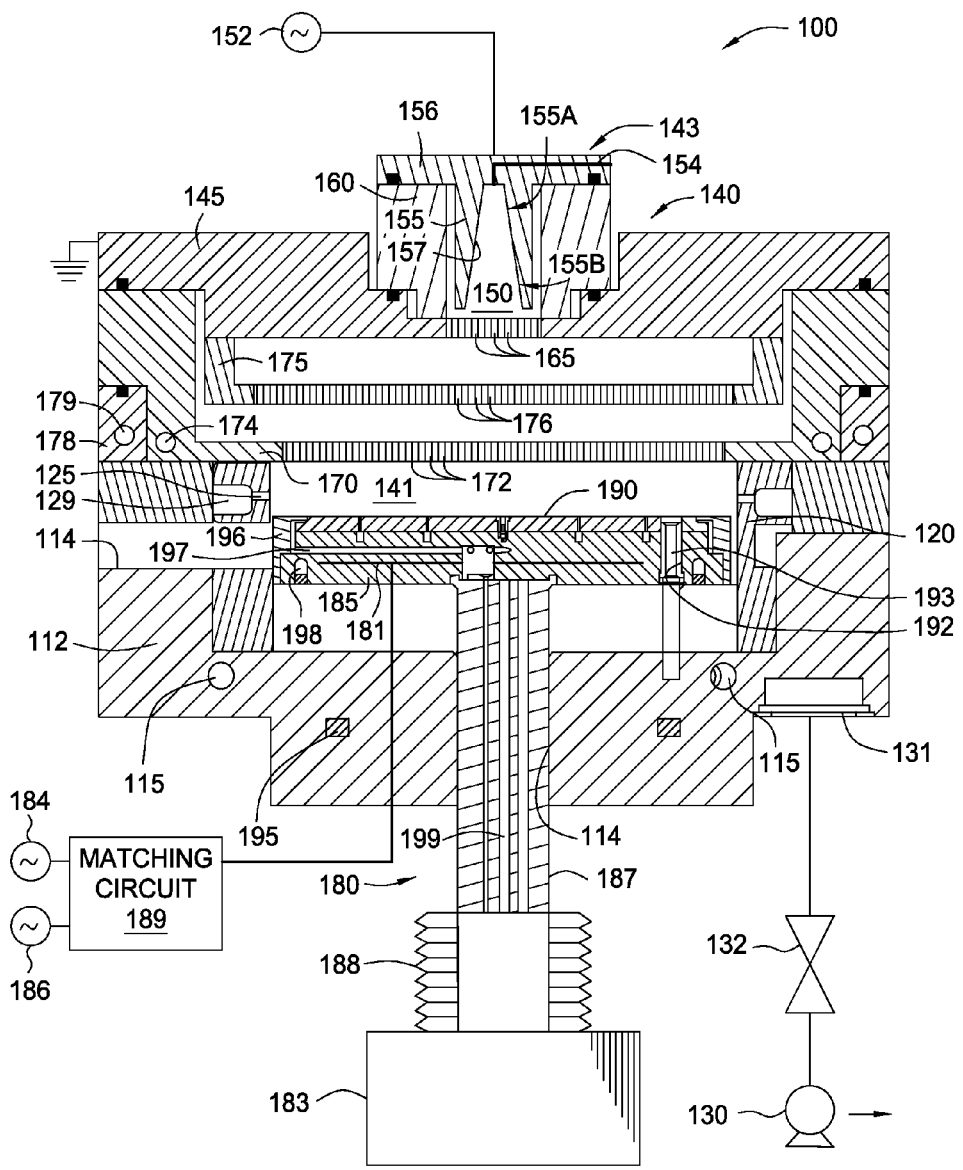
FIG. 1 is a cross section view of an illustrative processing chamber in which embodiments of the invention may be practiced.

FIG. 1 is a cross sectional view of an illustrative processing chamber 100 suitable for conducting an etching process as further described below. The chamber 100 may be configured to remove materials from a material layer disposed on a substrate surface. The chamber 100 is particularly useful for performing the plasma assisted dry etch process. The processing chamber 100 may be a Siconi™ chamber, which is available from Applied Materials, Santa Clara, Calif. It is noted that other vacuum processing chambers available from other manufactures may also be adapted to practice the present invention.

The processing chamber 100 provides both heating and cooling of a substrate surface without breaking vacuum. In one embodiment, the processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more embodiments, the chamber body 112 includes a channel 115 formed therein for flowing a heat transfer fluid therethrough. The heat transfer fluid can be a heating fluid or a coolant and is used to control the temperature of the chamber body 112 during processing and substrate transfer. Control of the temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 112 can further include a liner 120 that surrounds the support assembly 180. The liner 120 is removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contaminants of the processing chamber 100. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143, 145.

In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof.

In one or more embodiments, the first electrode 143 has an expanding section 155 that houses the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150.

In one or more embodiments, the expanding section 155 resembles an inverted truncated cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific process requirements and/or limitations.

As mentioned above, the expanding section 155 of the first electrode 143 varies the vertical distance between the first electrode 143 and the second electrode 145 because of the gradually increasing inner surface 157 of the first electrode 143. That variable distance is directly related to the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma can be formed within the lid assembly 140. As the plasma generated in the plasma cavity 150 is defined in the lid assembly 140 prior to entering into a processing region 141 above the support assembly 180 wherein the substrate is proceed, the plasma is considered as a remote plasma source that generated remotely from the processing region 141.

The expanding section 155 is in fluid communication with the gas inlet 154 as described above. The first end of the one or more gas inlets 154 can open into the plasma cavity 150 at the upper most point of the inner diameter of the expanding section 155. Similarly, the first end of the one or more gas inlets 154 can open into the plasma cavity 150 at any height interval along the inner diameter 157 of the expanding section 155. Although not shown, two gas inlets 154 can be disposed at opposite sides of the expanding section 155 to create a swirling flow pattern or "vortex" flow into the expanding section 155 which helps mix the gases within the plasma cavity 150.

The lid assembly 140 can further include an isolator ring 160 that electrically isolates the first electrode 143 from the second electrode 145. The isolator ring 160 can be made from aluminum oxide or any other insulative, process compatible material. The isolator ring 160 surrounds or substantially surrounds at least the expanding section 155.

The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. A hinge assembly (not shown) can be used to couple the lid rim 178 to the chamber body 112. The lid rim 178 can include an embedded channel or passage 179 for housing a heat transfer medium. The heat transfer medium can be used for heating, cooling, or both, depending on the process requirements.

In one or more embodiments, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. The apertures 172 can be sized and positioned about the distribution plate 170 to provide a controlled and even flow distribution to the chamber body 112 where the substrate to be processed is located. Furthermore, the apertures 172 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 170 includes one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above.

Alternatively, a heat transfer medium can be passed through the passage 174. The one or more passages 174 can contain a cooling medium, if needed, to better control temperature of the distribution plate 170 depending on the process requirements within the chamber body 112. Any heat suitable transfer medium may be used, such as nitrogen, water, ethylene glycol, or mixtures thereof, for example.

In one or more embodiments, the lid assembly 140 can be heated using one or more heat lamps (not shown). Typically, the heat lamps are arranged about an upper surface of the distribution plate 170 to heat the components of the lid assembly 140 including the distribution plate 170 by radiation.

The blocker plate 175 may optionally be disposed between the second electrode 145 and the distribution plate 170 when present. The blocker plate 175 is removably mounted to a lower surface of the second electrode 145. The blocker plate 175 may be in good thermal and electrical contact with the second electrode 145. In one or more embodiments, the blocker plate 175 can be coupled to the second electrode 145 using a bolt or similar fastener. The blocker plate 175 can also be threaded or screwed onto an outer diameter of the second electrode 145.

The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in this view) for processing within the chamber body 112. The support member 185 can be coupled to a lift mechanism 183 through a shaft 187 which extends through a centrally-located opening 114 formed in a bottom surface of the chamber body 112. The lift mechanism 183 can be flexibly sealed to the chamber body 112 by a bellows 188 that prevents vacuum leakage from around the shaft 187. The lift mechanism 183 allows the support member 185 to be moved vertically within the chamber body 112 between a process position and a lower transfer position. The transfer position is slightly below the slit valve opening 114 formed in a sidewall of the chamber body 112.

In one or more embodiments, the support member 185 has a flat, circular surface or a substantially flat, circular surface for supporting a substrate to be processed thereon. The support member 185 may be constructed of aluminum. The support member 185 can include a removable top plate 190 made of some other material, such as silicon or ceramic material, for example, to reduce backside contamination of the substrate.

In one or more embodiments, the substrate (not shown) may be secured to the support member 185 using a vacuum chuck. In one or more embodiments, the substrate (not shown) may be secured to the support member 185 using an electrostatic chuck. An electrostatic chuck typically includes at least a dielectric material that surrounds an electrode 181, which may be located in the support member 185 or formed as an integral part of the support member 185. The dielectric portion of the chuck electrically insulates the chuck electrode from the substrate and from the remainder of the support assembly 180.

In one embodiment, the electrode 181 that is coupled to a plurality of RF power bias sources 184, 186. The RF bias power sources 184, 186 are coupled between the electrode 181 disposed in the support member 185. The RF bias power excites and sustains a plasma discharge formed from the gases disposed in the processing region 141 of the chamber body.

In the embodiment depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The lift ring 195 is movable such that the upper surface of the lift-pin 193 can be extended above the substrate support surface of the support member 185 when the lift ring 195 is in an upper position. Conversely, the upper surface of the lift-pins 193 is located below the substrate support surface of the support member 185 when the lift ring 195 is in a lower position. Thus, each lift-pin 193 is moved in its respective bore 192 in the support member 185 when the lift ring 195 moves from either the lower position to the upper position.

The support assembly 180 can further include an edge ring 196 disposed about the support member 185. In one or more embodiments, the edge ring 196 is an annular member that is adapted to cover an outer perimeter of the support member 185 and protect the support member 185 from deposition. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the support member 185. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flowrate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

In operation, the support member 185 can be elevated to a close proximity of the lid assembly 140 to control the temperature of the substrate being processed. As such, the substrate can be heated via radiation emitted from the distribution plate 170. Alternatively, the substrate can be lifted off the support member 185 to close proximity of the heated lid assembly 140 using the lift pins 193 activated by the lift ring 195.

A system controller (not shown) can be used to regulate the operations of the processing chamber 100. The system controller can operate under the control of a computer program stored on a memory of a computer. The computer program may include instructions that enable the preclean process described below to be performed in the processing chamber 100. For example, the computer program can dictate the process sequencing and timing, mixture of gases, chamber pressures, RF power levels, susceptor positioning, slit valve opening and closing, wafer cooling and other parameters of a particular process.

Figure 2:
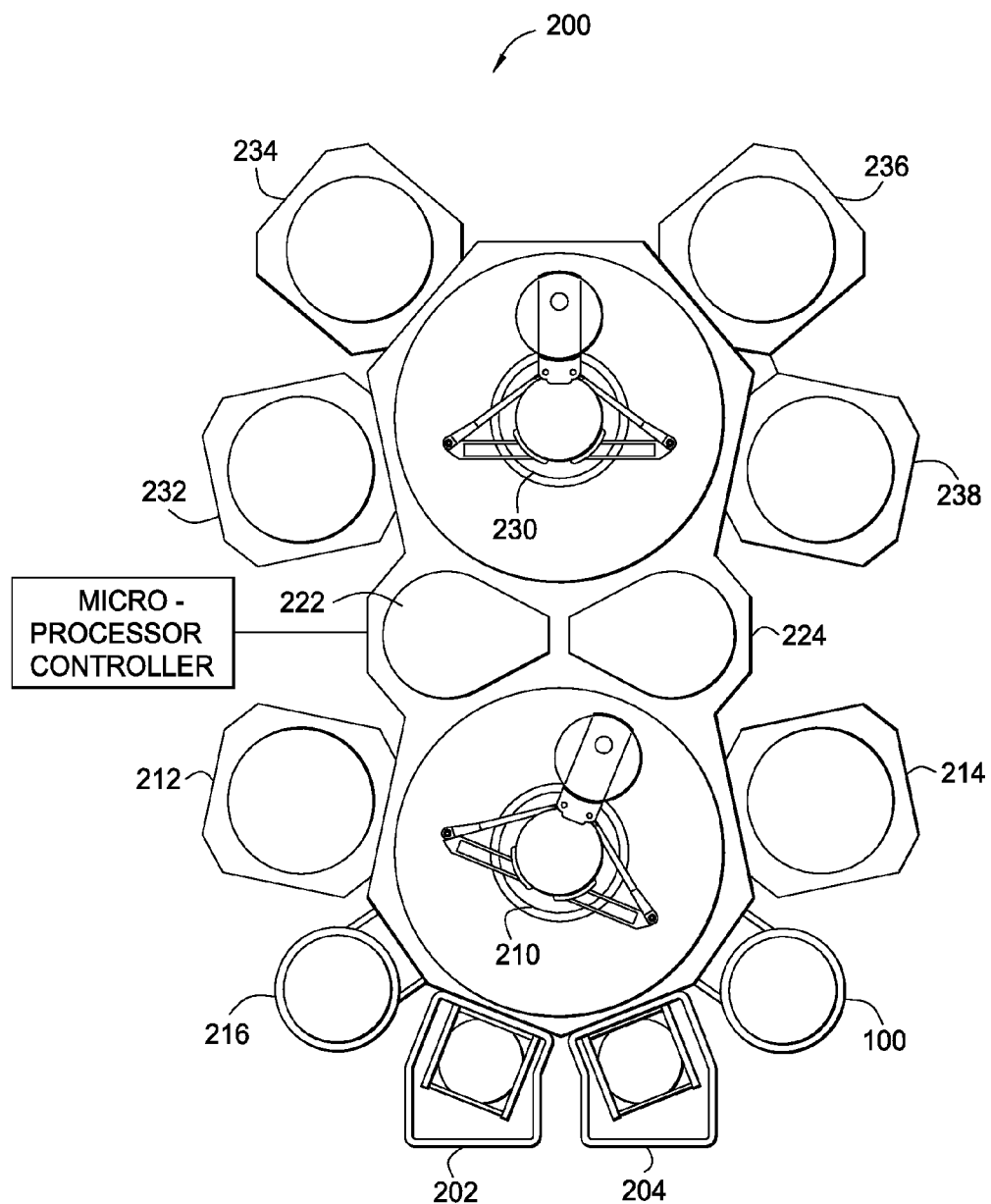
FIG. 2 is a schematic top-view diagram of an illustrative multi-chamber processing system.

FIG. 2 is a schematic top-view diagram of an illustrative multi-chamber processing system 200 that can be adapted to perform processes as disclosed herein having the processing chamber 100 coupled thereto. The system 200 can include one or more load lock chambers 202, 204 for transferring substrates into and out of the system 200. Typically, since the system 200 is under vacuum, the load lock chambers 202, 204 can "pump down" the substrates introduced into the system 200. A first robot 210 can transfer the substrates between the load lock chambers 202, 204, and a first set of one or more substrate processing chambers 212, 214, 216, 100 (four are shown). Each processing chamber 212, 214, 216, 100 is configured to perform at least one of substrate processing operations, such as an etching process, atomic layer etching (ALE), cyclical layer deposition (CLD), atomic layer deposition (ALD), chemical vapor deposition (CVD), physical vapor deposition (PVD), degas, orientation and other substrate processes. The position of the processing chamber 100 utilized to perform the etching process relative to the other chambers 212, 214, 216 is for illustration, and the position of the processing chamber 100 may be optionally be switched with any one of the processing chambers 212, 214, 216 if desired.

The first robot 210 can also transfer substrates to/from one or more transfer chambers 222, 224. The transfer chambers 222, 224 can be used to maintain ultra-high vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 100, the processing chambers 232, 234, 236, 238 can be outfitted to perform a variety of substrate processing operations including the dry etch processes described herein any other suitable process including deposition, pre-clean, degas, and orientation, for example. Any of the substrate processing chambers 212, 214, 216, 100, 232, 234, 236, 238 can be removed from the system 200 if not necessary for a particular process to be performed by the system 200.

Figure 3:
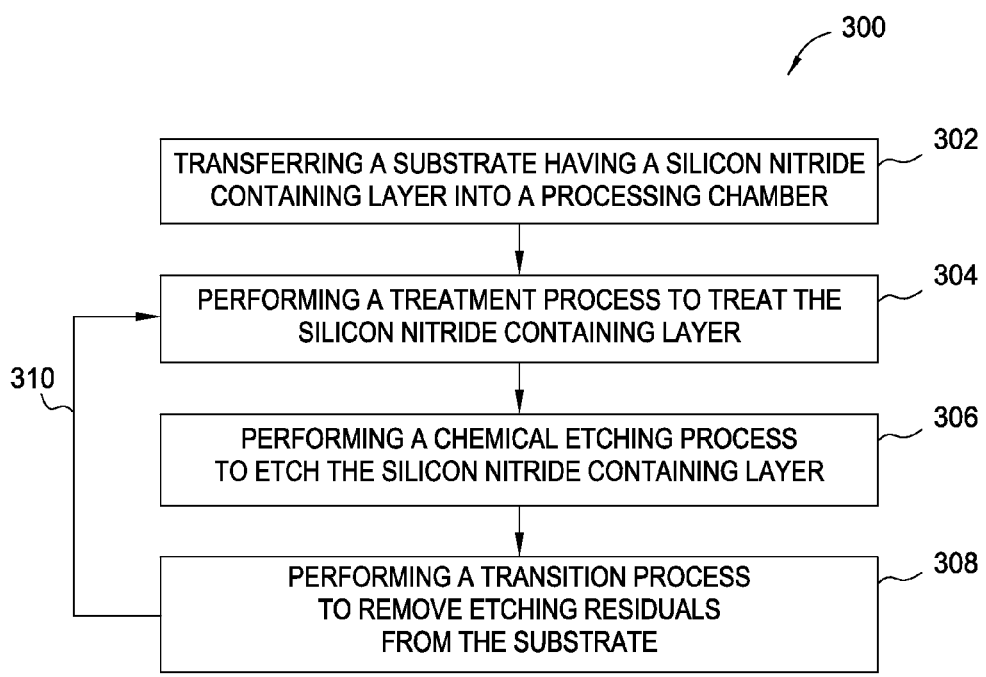
FIG. 3 depicts a flow diagram for etching an etching stop layer using a cyclical etching process in accordance with one embodiment of the present invention.

FIG. 3 illustrates a method 300 for performing an etching process to etch an etching stop layer disposed on a substrate with high selectivity and good profile control. The method 300 described in FIG. 3 corresponds to the sequence of fabrication stages depicted in FIGS. 4A-4D, which is discussed below. FIGS. 4A-4D illustrate schematic cross-sectional views of a substrate 402 having a film stack 450 formed thereon during different stages of etching an etching stop layer 404 disposed in the film stack 450 illustrated by the method 300.

Figure 4A:
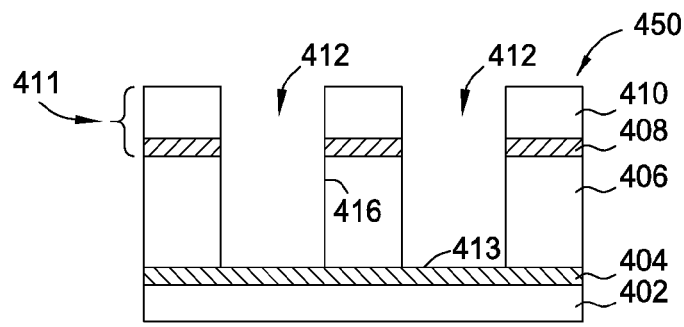
FIGS. 4A-4D depict cross-sectional views of an etching stop layer disposed on a semiconductor substrate during the etching of the etching stop layer in accordance with one embodiment of the present invention.

The method 300 starts at block 302 by transferring a substrate, such as the substrate 402 depicted in FIG. 4A, into the processing chamber, such as the processing chamber 100 depicted in FIG. 1, or other suitable processing chamber. The substrate 402 may have a substantially planar surface, an uneven surface, or a substantially planar surface having a structure formed thereon. The substrate 402 shown in FIG. 4A includes a film stack 450 formed on the substrate 402. In one embodiment, the substrate 402 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the film stack 450 includes a material layer 406 disposed on the etching stop layer 404 on the substrate 402. In one embodiment, the material layer 406 and the etching stop layer 404 may be utilized to form a gate structure, shallow trench isolation (STI) structure, a contact structure or an interconnection structure in the front end or back end processes. In one embodiment, the method 300 may be performed on the etching stop layer 404 to form a contact structure in the material layer 406 and the etching stop layer 404 therein. In one embodiment, the etch stop layer 404 may be a silicon dielectric layer, such as a silicon nitride layer (SiN) and silicon oxynitride layer (SiON). In the embodiment wherein the etching stop layer 404 (e.g., a silicon nitride layer) is utilized in a contact structure, the substrate may include s contact metal silicide formed therein directly underneath the etching stop layer 404 to be exposed after the etching stop layer 404 is removed and etched away. Suitable examples of the contact metal silicide may include tungsten, tungsten silicide, Ti/Co alloy silicide, Ti/Ni alloy silicide, Co/Ni alloy silicide and Ni/Pt silicide.

The material layer 406 may be a dielectric layer selected from a group consisting of an oxide layer, a nitride layer, titanium nitride layer, a composite of oxide and nitride layer, at least two or more oxide layers sandwiching a nitride layer, and combinations thereof, among others. Other suitable materials for the dielectric layer include undoped silicon glass (USG), such as silicon oxide or TEOS, boron-silicate glass (BSG), phosphorus-silicate glass (PSG), boron-phosphorus-silicate glass (BPSG) and combinations thereof. In an exemplary embodiment depicted herein, the material layer 406 is an undoped silicon glass (USG) layer. In one embodiment, the dielectric material layer 406 has a thickness between about 3000 Å to about 15000 Å, such as between about 4000 Å to about 12000 Å, for example about 10000 Å.

A patterned mask layer 411 is disposed on the material layer 406. The patterned mask layer 411 has an open feature 412 that exposes portions 413 of the surface of the etching stop layer 404 for etching. In one embodiment, the mask layer 411 may be a hardmask layer, a photoresist mask or a combination thereof. The open feature 412 in the mask layer 411 is used as an etch mask to form open features 414 in the etching stop layer 404 with desired aspect ratios. The open features 414 described herein may include trenches, vias, openings and the like. In one embodiment wherein the mask layer 411 is a hardmask layer, the mask layer 411 may be a material selected from a group consisting of silicon, silicon oxide, silicon nitride, silicon oxynitride, silicon carbide, amorphous carbon, and combinations thereof. In the embodiment wherein the mask layer 411 is a patterned photoresist layer, such as a lithographically patterned mask. The photoresist layer may is a positive tone photoresist, a negative tone photoresist, a UV lithography photoresist, an i-line photoresist, an e-beam resist (for example, a chemically amplified resist (CAR)) or other suitable photoresist. In an exemplary embodiment depicted in FIG. 4A, the patterned mask layer 411 is a combination of a photoresist layer 410 disposed on a hard mask layer 408 and the hard mask layer 408 is a silicon nitride layer or a silicon oxide layer.

Figure 4B:
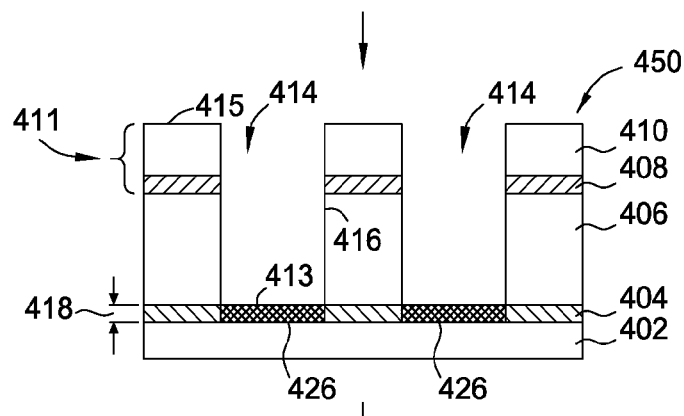

At block 304, a treatment process is performed to treat the exposed 413 portions of the surface of the etching stop layer 404 to alter the surface properties to facilitate removal of the etching stop layer 404 in the subsequent chemical etching process. The treatment process performed at block 304 includes supplying a treatment gas mixture into the chamber 100. A plasma is then formed from the treatment gas mixture to plasma treat the exposed portions 413 of the surface of the etching stop layer 404 to activate the etching stop layer 404 into an excited state, forming a treated etching stop layer 426, as shown in FIG. 4B, which may then easily react with chemical etching gases subsequently supplied into the processing chamber 100, forming volatile gas byproducts which can be readily pumped out of the processing chamber 100.

In one embodiment, the treatment gas mixture includes at least one of a hydrogen containing gas, a nitrogen containing gas, or an inert gas. It is believed that the hydrogen containing gas, the nitrogen containing gas, or inert gas supplied in the treatment gas mixture may assist increasing the lifetime of the ions in the plasma formed from the treatment gas mixture. Increased lifetime of the ions may assist reacting with and activating the etching stop layer 426 on the substrate 402 more thoroughly, thereby enhancing the removal of the activated etching stop layer 426 from the substrate 402 during the subsequent chemical etching process. In the embodiment wherein the nitrogen containing gas is utilized in the treatment gas mixture, the nitrogen atoms from the nitrogen containing gas may react with the oxygen atoms in the material layer 406 and/or in the etching stop layer 404 to form a nitrogen-oxygen (NO, or NO*) compound in a volatile state, which may be easily removed from the substrate surface and pumped out of the processing chamber. In the embodiment wherein the hydrogen containing gas is utilized in the treatment gas mixture, the hydrogen atoms from the hydrogen containing gas may react with the silicon atoms contained in the etching stop layer 404, thereby forming weak and dangling bond of Si—H or Si—OH bond on the treated surface (e.g., the exposed portion 413) of the treated material layer 426. The treated etching stop layer 426 with Si—H or Si—OH bond terminals may easily to be absorbed by other etchants subsequently supplied to the processing chamber 100, thereby assisting ease of removal of the treated etching stop layer 426 from the substrate surface. Similarly, in the embodiment wherein an inert gas, such as He or Ar, is utilized, the inert gas may treat and gently bombard the etching stop layer 404 to activate the etching stop layer 404 to an excited state, thereby assisting reacting with the etchants supplied to the processing chamber 100.

In one embodiment, the hydrogen containing gas supplied into the processing chamber 100 includes at least one of $H_2$, $H_2O$, and the like. The nitrogen containing gas supplied into the processing chamber 100 includes at $N_2$, $N_2O$, $NO_2$, $NH_3$ and the like The inert gas supplied into the processing chamber 100 includes at least one of Ar, He, Kr, and the like. In an exemplary embodiment, the hydrogen containing gas supplied in the processing chamber 100 to perform the treatment process is $H_2$ gas, and the nitrogen containing gas supplied in the processing chamber 100 to perform the treatment process is $N_2$ gas and the inert gas is He or Ar.

During the plasma treatment process, several process parameters may be regulated to control the pretreatment process. In one exemplary embodiment, a process pressure in the processing chamber 100 is regulated between about 10 mTorr to about 5000 mTorr, such as between about 10 mTorr and about 200 mTorr. A low RF bias power at a frequency of about 13 MHz may be applied to maintain a plasma in the treatment gas mixture. For example, a RF bias power about less than 200 Watts, such as between about 20 Watts and about 200 Watts, may be applied to maintain a plasma inside the processing chamber 100. The treatment gas mixture may be flowed into the chamber at a rate between about 200 sccm to about 800 sccm. A substrate temperature is maintained between about 25 degrees Celsius to about 300 degrees Celsius, such as between about 50 degrees Celsius and about 110 degrees Celsius.

In one embodiment, the substrate is subjected to the treatment process for between about 5 seconds to about 5 minutes, depending on the operating temperature, pressure and flow rate of the gas. For example, the substrate can be exposed to the pretreatment processes for about 30 seconds to about 90 seconds. In an exemplary embodiment, the substrate is exposed to the treatment process for about 90 seconds or less.

Figure 4C:
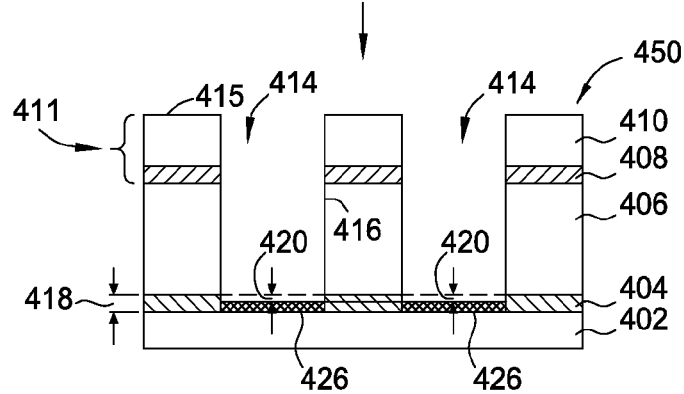

At block 306, a chemical etching process is performed to slowly remove the treated etching stop layer 426 from the substrate 402, as shown in FIG. 4C. The chemical etching process is performed by supplying a chemical etching gas mixture through the plasma cavity 150 into the processing chamber 100 to form a remote plasma source in the plasma cavity 150 from the chemical etching gas mixture for etching the treated etching stop layer 426. As the treated etching stop layer 426 has been treated to have weak and dangling bonds with Si—H or Si—OH bond terminals on the surface, the aggressive etchants from the chemical etching gas mixture may easily attack the weak and dangling bonds with Si—H or Si—OH bond terminals and efficiently remove the treated etching stop layer 426 from the substrate 402 during the chemical etching process.

In one embodiment, the chemical etching gas mixture used to remove the treated etching stop layer 426 is a mixture of ammonia ($NH_3$) and nitrogen trifluoride ($NF_3$) gases. The amount of each gas introduced into the processing chamber may be varied and adjusted to accommodate, for example, the thickness of the etching stop layer 426 to be removed, the geometry of the substrate being cleaned, the volume capacity of the plasma, the volume capacity of the chamber body, as well as the capabilities of the vacuum system coupled to the chamber body.

In one or more embodiments, the gases added to provide a chemical etching gas mixture having at least a 1:1 molar ratio of ammonia ($NH_3$) to nitrogen trifluoride ($NF_3$). In one or more embodiments, the molar ratio of the chemical etching gas mixture is at least about 3:1 (ammonia to nitrogen trifluoride). The gases are introduced in the chamber 100 at a molar ratio of from about 3:1 (ammonia to nitrogen trifluoride) to about 30:1, such as about 5:1. It is noted that the ration between the ammonia ($NH_3$) to nitrogen trifluoride ($NF_3$) may also be adjusted to improve the etching selectivity, including the selectivity between the treated etching stop layer 426 and the adjacent material layer 406 (e.g., selectivity of the silicon nitride layer to the silicon oxide layer) and the selectivity between the treated etching stop layer 426 and the underlying substrate 402 (e.g., selectivity of the silicon nitride layer to materials in the substrate, such as a silicon material, a conductive material or a metal silicide layer, among others).

As the etching stop layer 426 often has a relatively thin thickness, as compared to the material layer 406 disposed above, the plasma generated remotely in the plasma cavity 150 during the chemical etching process at block 306 may have the etchants dissociated to form a relatively mild and gentle etchants, so as to slowly, gently and gradually etch the treated etching stop layer 426 until the underlying substrate 402 is exposed. As compared to conventional in-situ plasma etching process, the chemical etching process performed at block 306 to remove the treated etching stop layer 426 may be controlled to proceed at a slow rate utilizing a remote plasma source, such as between about 1 Å per second and about 10 Å per second, so as to provide good control for the interface etching, thereby allowing precise etching end point for the treated etching stop layer 426 being removed from the substrate 402 without damaging the adjacent material layer 406. The chemical etching process is configured to chemically react and remove the treated etching stop layer 426 from the substrate 402 without overly aggressive and physical bombarding, sputtering or biasing the substrate surface, thereby providing a mild etching process that slowly removes the treated etching stop layer 426. Each cycle of the chemical etching process may only etch away about 25 Å of the treated etching stop layer 426 so as to slowly remove the treated etching stop layer 426 with good profile control, thereby reducing likelihood of over-etching to the substrate, profile deformation, or loss of CD control.

Furthermore, it is believed that the etchants, such as $NH_3$ and $NF_3$, may aggressively react with the treated etching stop layer 426 while gently reacting with the oxygen atoms/oxygen radials released from the material layer 406 and/or the mask layer 411. The nitrogen elements dissociated from the etching gas mixture may promptly react with the oxygen elements released from the material layer 406, which is dissociated either during the treatment process at block 304 or the chemical etching process at block 306. The nitrogen elements and the oxygen elements are then reacted to form a nitrogen-oxygen (NO, or NO*) compound, protecting sidewalls of the opening features 414 in the material layer 406 and helping to etch the silicon nitride layer efficiently. As the sidewall of the material layer 406 is protected, it helps confining the etchants to have a desired directionality to anisotropically etch the treated etching stop layer 426, thereby enhancing the etching efficiency and profile control. Additionally, the nitrogen-oxygen (NO, or NO*) compound generated during the etching process may also be in a volatile state, which may be easily removed from the substrate surface and pumped out of the processing chamber after the etching process.

During the chemical etching process, several process parameters may be regulated to control the chemical etching process at block 306. In one exemplary embodiment, a process pressure in the processing chamber 100 is regulated to between about 10 mTorr and about 5000 mTorr, such as between about 800 mTorr and about 5 Torr, for example about 1500 mT. A RF source power is provided at a frequency of about 60 MHz to maintain a plasma in the chemical etching gas mixture. For example, a RF source power of about 20 Watts to about 800 Watts, such as about 400 Watts, may be chemical etching gas mixture may be flowed into the chamber at a rate between about 15 sccm to about 200 sccm. In one example, the $NH_3$ gas may be supplied in the etching gas mixture at a rate between about 5 sccm and about 300 sccm, such as between about 20 sccm and about 300 sccm, such as about 100 sccm. The $NF_3$ gas may be supplied in the etching gas mixture at a rate between about 5 sccm and about 300 sccm, such as between about 5 sccm and about 50 sccm, such as about 20 sccm. In one embodiment, an inert gas, such as Ar or He, may also be supplied in the etching gas mixture. In one embodiment, a He gas is used and supplied in the etching gas mixture between about 200 sccm and about 1000 sccm, such as about 600 sccm. A substrate temperature is maintained between about 25 degrees Celsius to about 300 degrees Celsius, such as between about 50 degrees Celsius and about 150 degrees Celsius, for example about 110 degrees Celsius. In one embodiment, no bias power is provided during the chemical etching process to reduce ion bombardment.

In the embodiment depicted in FIG. 4C, after the first cycle of the chemical etching, the treated material layer 426 may have a thickness 420 of between about 20 Å and about 50 Å removed from the substrate 402.

At block 308, an optional transition process may be performed to remove etching residuals from the substrate surface. A transition gas mixture including a purge gas or carrier gas can be supplied to the processing chamber to assist pumping/purging the etching residuals from the processing chamber. Suitable purge/carrier gases include argon, helium, hydrogen, nitrogen, or mixtures thereof. The operating pressure within the chamber can be varied. Application of the RF source or RF bias powers may be eliminated during the pump/purge process, e.g., the transition process is performed without applying a RF power during the transition process. The purge/carrier gas can be used to facilitate the pump/purge of the etching residuals from the processing chamber. In one embodiment, the substrate is subjected to the transition process for between about 5 seconds to about 5 minutes. For example, the substrate can be exposed to the transition process for about 5 seconds to about 10 seconds. In an exemplary embodiment, the substrate is exposed to the transition process for about 5 seconds.

Figure 4D:
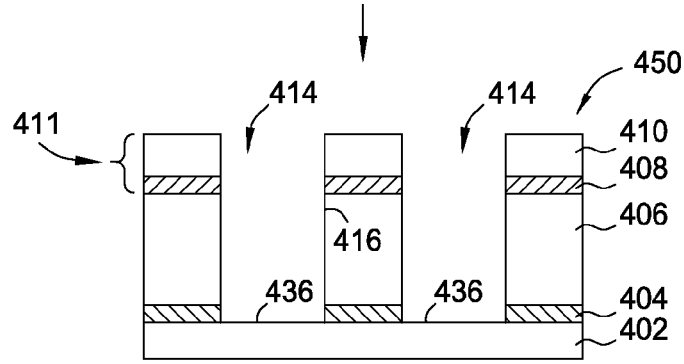

It is noted that blocks 304, 306 and 308 may be repeatedly (i.e., cyclically) performed, as indicated by the loop 310 in FIG. 3, until the etching stop layer 404 exposed by the feature 414 defined between the mask layer 411 and the material layer 406 is removed, as shown in FIG. 4D, exposing a surface 436 of the underlying substrate 402. In one embodiment, the etching stop layer 404 may have a thickness between about 5 nm and about 500 nm, such as about 10 nm and about 35 nm. The repeated processes may cyclically and incrementally etch the treated etching stop layer 426 without over aggressively attacking the material layer 406, thereby providing a good interface etching control and a proper etch stop endpoint. Incremental etching with repetitive treatment, chemical etching process and/or the optional transition process that improves feature verticality and promotes etching selectivity among the material layer 406, the etch stop layer 404 and the underlying substrate 402, thereby enhancing accuracy of mask to transfer feature critical dimensions (CD) from the mask layer 411 and the material layer 406 to the etching stop layer 404. In one embodiment, the feature formed in the mask layer 411 may have a CD less than 40 nm and an aspect ratio greater than 7, such as between about 5 and about 10.

Thus, a method and an apparatus for cyclically etching an etching stop layer with high selectivity and good profile control are provided. The method may allow a proper etching stop endpoint with good interface control while providing an acceptable range of overall etching throughput. The etching process utilizing a cyclic multiple step etching process, e.g., a treatment process, a chemical cleaning process and an optional transition process, to etch features into an etching stop layer without aggressively attacking the material layer 406. The cyclic multiple-step etching process can efficiently etch an etching stop layer with high selectivity and good profile control without significantly degrading of the overall process time.

While the foregoing is directed to embodiments of the present invention, other and further embodiments of the invention can be devised without departing from the basic scope thereof, and the scope thereof is determined by the claims that follow.

The invention claimed is:

1. A method for etching an etching stop layer comprising:
    (a) performing a treatment process on the substrate having a silicon nitride layer disposed thereon by supplying a treatment gas mixture into the processing chamber to treat the silicon nitride layer;
    (b) performing a chemical etching process on the substrate by supplying a chemical etching gas mixture into the processing chamber, wherein the chemical etching gas mixture includes at least an ammonium gas and a nitrogen trifluoride, wherein the chemical etching process etches the treated silicon nitride layer; and
    repeatingly performing step (a)-step (b) to etch the silicon nitride layer until an underlying substrate is exposed.

2. The method of claim 1, further comprising:
    (c) performing a transition process on the etched substrate by supplying a transition gas mixture into the processing chamber after performing step (b).

3. The method of claim 2, wherein the transition gas mixture includes at least a hydrogen containing gas, a nitrogen containing gas or an inert gas.

4. The method of claim 2, further comprising:
    repeatingly performing step (a)-step (c) to etch the silicon nitride layer until an underlying substrate is exposed.

5. The method of claim 2, wherein performing the transition process further comprises:
    supplying the transition gas mixture to remove etching residual without applying a RF power.

6. The method of claim 1, wherein the treatment gas mixture includes at least a hydrogen containing gas, a nitrogen containing gas or an inert gas.

7. The method of claim 1, wherein performing the treatment process on the substrate further comprises:
    applying a RF bias power to the treatment gas mixture.

8. The method of claim 1, wherein performing the chemical etching process on the substrate further comprises:
    applying a RF source power to the chemical etching gas mixture remotely from the processing chamber.

9. The method of claim 1, wherein performing the chemical etching process on the substrate further comprises:

supplying the ammonium gas and the nitrogen trifluoride in the chemical etching gas mixture a molar ratio of from about 5:1.

10. The method of claim 1, further comprising:
maintaining a substrate temperature between about 50 degrees and about 150 degrees Celsius.

11. The method of claim 1, wherein the silicon nitride layer is an etching stop layer utilized in a contact structure in a semiconductor device.

12. A method for etching an etching stop layer comprising:
(a) transferring a substrate having a silicon nitride layer disposed thereon in a processing chamber, wherein a patterned silicon oxide layer along with a pattered mask layer disposed on the silicon nitride layer exposing a portion of the silicon nitride layer;
(b) supplying a treatment gas mixture to treat the exposed portion of the silicon nitride layer, wherein the treatment gas mixture includes an inert gas; and
(c) supplying a chemical etching gas mixture into the processing chamber, wherein the chemical etching gas mixture includes at least an ammonium gas and a nitrogen trifluoride to etch the treated silicon nitride layer; and
repeatingly performing steps (b) and (c) until the exposed portion of the silicon nitride layer is removed from the substrate.

13. The method of claim 12, further comprising:
(d) supplying a transition gas mixture to the processing chamber, wherein the transition gas mixture includes an inert gas after performing step (c).

14. The method of claim 12, wherein the ammonium gas and the nitrogen trifluoride in the chemical etching gas mixture a molar ratio of from about 3:1 to about 30:1.

15. The method of claim 12, further comprises:
applying a RF bias power to the treatment gas mixture;
applying a RF source power remotely from the processing chamber to the chemical etching gas mixture.

16. The method of claim 13, wherein supplying the transition gas mixture further comprises:
supplying the transition gas mixture to remove etching residual without applying a RF power.

17. A method for etching a silicon nitride layer comprising:
(a) transferring a substrate having a silicon nitride layer disposed on a metal silicide structure into a processing chamber, wherein the silicon nitride layer has a patterned silicon oxide layer along with a pattered mask layer disposed thereon exposing a portion of the silicon nitride layer;
(b) supplying a Ar or He gas while applying a RF bias power to treat the exposed silicon nitride layer;
(c) supplying a chemical etching gas mixture including at least an ammonium gas and a nitrogen trifluoride while applying a RF source power remotely from the processing chamber to etch the treated silicon nitride layer; and
(d) supplying a Ar or He gas to the processing chamber without applying a RF power.

18. The method of claim 17, further comprising:
repeatedly performing steps (b) to (d) until the exposed portion of the silicon nitride layer is removed exposing the underlying metal silicide structure.

* * * * *

UNITED STATES PATENT AND TRADEMARK OFFICE
CERTIFICATE OF CORRECTION

| | | |
|---|---|---|
| PATENT NO. | : 8,980,758 B1 | |
| APPLICATION NO. | : 14/029769 | |
| DATED | : March 17, 2015 | |
| INVENTOR(S) | : Ling et al. | |

It is certified that error appears in the above-identified patent and that said Letters Patent is hereby corrected as shown below:

In the Specification

Column 4, Line 66, please delete "1558" and insert -- 155B -- therefor.

Signed and Sealed this
Eighth Day of September, 2015

Michelle K. Lee
*Director of the United States Patent and Trademark Office*